(12) United States Patent
Wilson

(10) Patent No.: US 6,300,884 B1
(45) Date of Patent: Oct. 9, 2001

(54) METHOD FOR DECODING A QUADRATURE ENCODED SIGNAL

(75) Inventor: David L. Wilson, New Berlin, WI (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/633,949

(22) Filed: Aug. 8, 2000

(51) Int. Cl.[7] ................................................ H03M 1/22
(52) U.S. Cl. ............................ 341/6; 341/8; 341/11; 341/116; 318/560; 318/561; 318/62; 324/160
(58) Field of Search ..................... 341/6, 8, 11, 116; 318/560, 561, 621; 324/160

(56) References Cited

U.S. PATENT DOCUMENTS

| | | | |
|---|---|---|---|
| 5,130,710 | * | 7/1992 | Salazar .................................... 341/11 |
| 5,187,479 | * | 2/1993 | Johnson, III et al. ................... 341/6 |
| 5,377,232 | * | 12/1994 | Davidov et al. ...................... 375/106 |
| 6,097,319 | * | 8/2000 | Liu ........................................... 341/8 |

OTHER PUBLICATIONS

Optoelectronics Designer's Catalog, Hewlett–Packard Co., pp. 86–101 (1993).

* cited by examiner

*Primary Examiner*—Michael Tokar
*Assistant Examiner*—Lam T. Mai
(74) *Attorney, Agent, or Firm*—Joanna G. Chiu

(57) ABSTRACT

A method of decoding a quadrature encoded signal where position tracking is implemented which decouples the position calculations from the encoder edges. In one embodiment of the present invention, a uni-directional pulse accumulator is used to count encoder edges, and a periodic interrupt timer is used to update the position information, where interrupts are generated independent from encoder edges. At slow speeds, the mode switches to monitor each encoder edge to check for direction reversal without requiring position information. This decodes bi-directional quadrature position information using a uni-directional counter and a count compensation method for resolving changes in direction.

31 Claims, 4 Drawing Sheets

METHOD FOR DECODING A QUADRATURE ENCODED SIGNAL

FIELD OF THE INVENTION

This invention relates generally to quadrature encoding and specifically to a method of decoding quadrature encoded signals.

RELATED ART

Motor controllers determine the angular or linear position of the motor and the number of revolutions of the motor to make a decision regarding control of the motor. The controller may provide feedback to implement the decision or may store the information for accounting purposes, such as to determine usage and wear of the motor. Typically an encoder is attached to the shaft of the motor. The encoder includes a disk having slots located around the perimeter. As the shaft rotates, the disk passes through a reader which detects the slots as they rotate. The revolution of the motor is determined by counting the number of slots passing through the reader. The reader is typically a slot type sensor that includes a light emitting diode (LED) on one side and a photoreceiver on the other.

Incremental quadrature encoders embed the position information into Two (2) signals with a quadrature phase relationship. Quadrature encoding is implemented by positioning Two (2) receivers each generating a signal. The encoded signals are then referred to as Channel A and Channel B. Direction information is encoded as the differential of the phase polarity of the signals, Channel A and Channel B. In one example, when the shaft rotates in a first direction, referred to as forward, Channel A is 90° out of phase with Channel B with Channel A leading Channel B. When the shaft rotates in the reverse direction, referred to as backward, Channel B leads Channel A. As the quadrature encoder generates Two (2) digital signals, and therefore there are Four (4) possible encoder states, HH, HL, LL, LH, where H refers to a logical high level and L refers to a logical low level.

Extraction of the position and direction information from these signals is often costly. Specifically, when the shaft rotates forward a counter increments on each state transition to identify position. When the shaft rotates backward the counter decrements on each state transition. Monitoring thus requires tracking each transition of the encoded signals.

According to one method, the motor controller monitors the signals in software to calculate position and direction. The resolution of the encoder is determined by the number of slots in the encoder disk. For high resolution encoders operating at high speed, many encoder edges are generated per second. The encoder interrupts the controller, or specifically a processor in the controller, on each transition of the signals. This requires excessive controller bandwidth as the controller performs the calculations using the encoder edges of both signals. The monitoring of the motor is thus limited by the speed of the encoder and the speed of the controller.

One method of control reduces the required bandwidth by monitoring only a single edge of one signal, such as the falling edge of Channel B. If the motor slows down, all edges are again monitored. This method reduces interrupts to the controller by a factor of Four (4) requiring only one quarter of the bandwidth. While an improvement, this method is still limited by the speed of the encoder and the controller. Additionally, the resolution of the encoder is reduced by a factor of Four (4).

Another type of controller provides the monitoring and calculations in external decode hardware. A problem exists as the decode hardware increases the size of the controller incurring greater expense.

A need therefore exists for a method of decoding a quadrature encoded signal in which the calculations are independent of the encoder edges. Additionally, it is desirable to reduce the number of interrupts to a controller used for decoding the quadrature encoded signals and thus reduce the impact on the bandwidth of the controller.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Embodiments of the present invention provide a method of decoding a quadrature encoded signal where the position calculations may be decoupled from the encoder edges. In one embodiment of the present invention, a uni-directional pulse accumulator is used to count encoder edges. A periodic interrupt timer is used to update the position information, where interrupts are generated independent from encoder edges. At slow speeds, the mode switches to monitor each encoder edge to check for direction reversal without requiring position information. Embodiments of the present invention decode bi-directional quadrature position information using a uni-directional counter and a count compensation method for resolving changes in direction.

According to one aspect of the present invention, a method for decoding a first channel and a second channel wherein each of the first and second channels is output by a quadrature encoder, includes calculating a position associated with the first and second channels in response to an encoder independent interrupt, comparing a speed associated with the first and second channels to a predetermined threshold, and enabling edge-triggered interrupts corresponding to the first and second channels if the speed is below the predetermined threshold.

According to another aspect of the present invention, a decoder for decoding a first channel and a second channel, wherein each of the first and second channels is output by a quadrature encoder, includes a control unit, an edge-triggered interrupt generator having a first input to receive the first channel and a second input to receive the second channel, and capable of being enabled to provide edge-triggered interrupts to the control unit, an encoder independent interrupt generator coupled to provide encoder independent interrupts to the control unit, a counter, coupled to the control unit, having an input to receive the first channel, and a memory unit coupled to the control unit. The memory unit includes a first plurality of instructions for calculating a position associated with the first and second channels in response to an encoder independent interrupt, and a second plurality of instructions for enabling the edge-triggered interrupt generator if a speed associated with the first and second channels is below a predetermined threshold.

Figure 1:
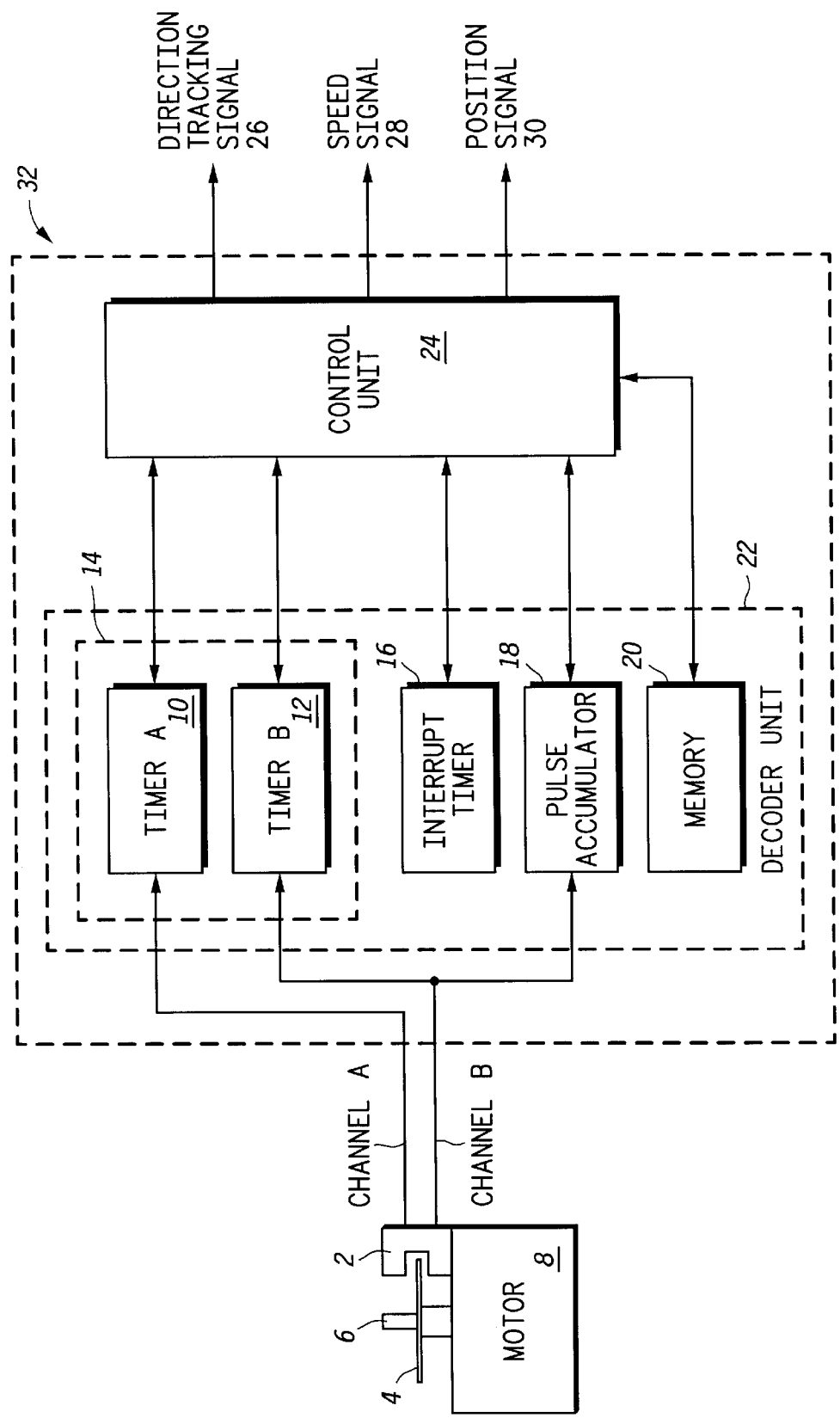
FIG. 1 illustrates in block diagram form a monitoring system coupled to a motor according to one embodiment of the present invention.

FIG. 1 illustrates a controller 32 coupled to a motor 8 the controller 32 implementing a method of monitoring the motor 8 according to one embodiment of the present invention. An encoder disk 4 is coupled to the shaft 6 of the motor 8, the encoder disk 4 having multiple slots or holes formed around the perimeter. As the shaft 6 rotates, the encoder disk 4 passes through an encoder 2. Encoder 2 may be a slot type sensor having an LED directed toward a photo-receiver on the opposite side of the sensor. The encoder detects the slots in the encoder disk 4. The encoder 2 generates quadrature signals, Channel A and Channel B. Channel A is provided to Timer A 10 in the controller 32, while Channel B is provided to a Timer B 12 and a Pulse Accumulator (PAC) 18 within the controller 32.

The controller 32 further includes a control unit 24, and a decoder unit 22, having an interrupt timer 16, an edge-triggered interrupt generator 14, a pulse accumulator (PAC) 18, and a memory 20. The control unit 24 may be a central processing unit (CPU) and may therefore also be referred to as CPU 24. The memory 20 stores the software program for decoding the quadrature encoded signals. The memory 20 may be a partition of a larger memory within the controller 32. The edge-triggered interrupt generator 14 includes Timer A 10 and Timer B 12 which are coupled to CPU 24. The edge-triggered interrupt generator 14 is applied during those times when the speed of the motor shaft 6 is below a threshold angular speed, and responds to transitions or edges of the encoder signals, Channel A and Channel B. The edge-triggered interrupt generator 14 informs the CPU 24 when to inspect Channel A and Channel B signals for a possible change in direction.

Operation of the interrupt timer 16 is independent of the interrupt generator 14. The interrupt timer 16 is coupled bi-directionally to the CPU 24, and the conditions for generating interrupts are provided from the CPU 24 to the interrupt timer 16. The interrupt timer 16 generates interrupts to the CPU 24 according to these conditions. For example, interrupt timer 16 may be a periodic interrupt timer which can be programmed to generate interrupts at a pre-determined sampled rate. The output of PAC 18 provides count information to the CPU 24 to determine the position of the shaft 6. CPU 24 interfaces with the memory 20 to execute the decode software stored in the memory 20 and to provide information back for storage in the memory 20. The CPU 24 outputs: i) a direction tracking signal 26 indicating the direction of angular motion of the motor 8; ii) a speed signal 28 indicating the speed of the motor 8; and iii) a position signal 30 indicating the position of the motor 8 with respect to the encoder disk 4. The CPU 24 may output more or less calculations depending on the uses of controller 32, and therefore, the outputs of CPU 24 are not limited to those listed above.

In operation, position tracking is separate from direction tracking. Positional information is determined from inspection of the encoder signals, and the PAC 18 count value. The sampling for positional information is performed independently from the encoder signal edges. The direction of rotation is determined or verified when the speed of the motor is reduced below a threshold. The speed of the motor is determined by the difference in the position calculations between consecutive samples. If the speed falls below that threshold, each transition of the encoder signals is inspected and the direction is determined from the encoder state. If a change in direction is detected, further calculations are required to determine the relative encoder position corresponding to the direction change.

Figure 2:
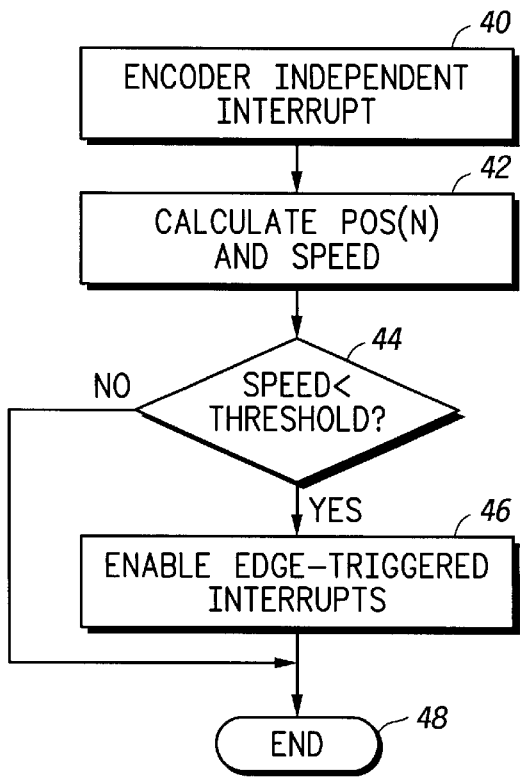
FIGS. 2–3 illustrate in flow diagram form a method of monitoring a motor, according to one embodiment of the present invention.
Figure 3:
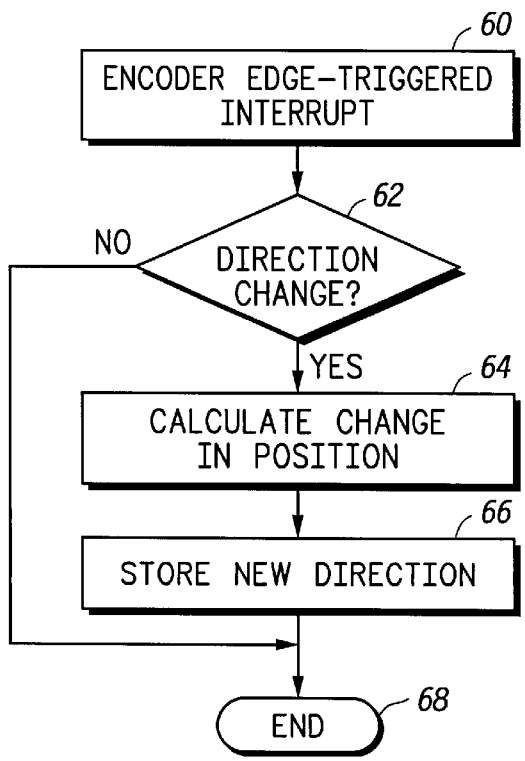

FIGS. 2 and 3 illustrate the interrupt service routines associated with the operation of the controller 32 for decoding the quadrature encoded signals. As illustrated in FIG. 2, an encoder independent interrupt is generated at block 40. In one embodiment, this is performed by interrupt timer 16. The interrupt to the CPU 24 is to determine the count of the PAC 18. Note that in one embodiment, PAC 18 should be interrogated at a rate which exceeds the rate at which the counter can wrap around through its full modulo value. The count of the PAC 18 is used to calculate the position and the speed of the motor 8 at block 42. If the speed of the motor 8 is below a threshold value at decision diamond 44, the process enables edge-triggered interrupts at block 46 (which are described further in reference to FIG. 3). Else, the process ends at block 48.

The position and speed calculations performed at block 42 begin with calculation of the new relative position, $P_n$ as:

$$P_n = 4 * \text{count} + b \qquad \text{Equation 1:}$$

where "count" is the current pulse accumulator count value, and "b" is a compensation factor which has been empirically established as a function of encoder state and direction. The following table, Table 1, illustrates one implementation of the compensation factor (b). The table identifies the "b" values as a function of encoder state and direction. In this table, H refers to a logical high level, and L to a logical low level.

TABLE 1

| Channel B | Channel A | Direction | b |
| --- | --- | --- | --- |
| H | H | Forward | 3 |
| L | H | Forward | 0 |
| H | H | Backward | 2 |
| H | L | Backward | 3 |
| L | L | Backward | 0 |
| L | H | Backward | 1 |
| L | L | Forward | 1 |
| H | L | Forward | 2 |

Continuing with the calculations of block 42, the current absolute position, Pos(n) is given as:

$$\text{Equation 2:} \quad Pos(n) = Pos(n-1) + dir(k)[P_n - P_o] + \sum_{i=1}^{k} \Delta(i)$$

The Pos(n−1) is the last calculated absolute position. The dir(k) is the present direction of rotation, where (+1) indicates a change to forward and (−1) indicates a change to backward. The $\Delta(i)$ series represents the position deltas resulting from changes in encoder direction; the calculation of which is summarized in block 64, and detailed later in this document. This method records these position deltas for use in determining the absolute position. $P_O$ is the old relative position and k is the number of direction changes that have occurred since the last update of Pos(n). For example, if no encoder direction changes have occurred since the last Pos(n) calculation, then k=0, and the value used for $P_O$ is simply $P_n$ from the previous Pos(n) calculation. However, if direction changes have occured, then k equals the number of direction changes since the last Pos(n) update, and $P_0$ is the relative position calculated at the last direction change. After the calculations are completed, $P_0$ is set to $P_n$, k is set to 0, and n is incremented.

As a uni-directional counter, PAC 18 is used to accumulate the count value tracking a bi-directional motion, where each encoder pulse of one encoder signal increments the count. The count is not decremented for the reverse direction, but rather the counter continues to count up. When a direction change occurs, therefore, the method must detect it, and determine whether the PAC value is used to create a positive position delta, or negative position delta.

FIG. 3 illustrates the direction tracking process, which is initiated by the encoder edge-triggered interrupt at block 60. If the speed of the motor 8 slows, it is possible that a change of direction is imminent. The process therefore checks for a direction change at decision diamond 62, where the process ends at block 68 if no change of direction is detected. On detection of a direction change, a new position delta is calculated at block 64. Detection of a direction change may be referred to as a direction change trigger, or as a trigger event. The new position delta, along with the new direction are stored in memory 20 at block 66. The process then ends at block 68.

The direction tracking calculations of block 64 are given as:

$k=k+1$            Equation 3:

$P(k)=4*count(k)+c(k)$            Equation 4:

$\Delta(k)=dir(k)[P_0-P(k)]$            Equation 5:

$P_0=P(k)+i(k)$            Equation 6:

where k is the trigger event counter, P(k) is the new relative position corresponding to the encoder state just prior to the direction change trigger, count(k) is the PAC 18 count value, c(k) is the correction factor as a function of trigger type, and the $\Delta(k)$ is the position delta between the new relative position P(k) and the old relative position ($P_0$). The dir(k) is the direction of rotation after the trigger event, which is +1 for forward direction, and −1 for reverse direction. The i(k) term is an increment value of (+/−1), which will be explained later. The above calculations are performed at each direction change trigger.

Figure 4:
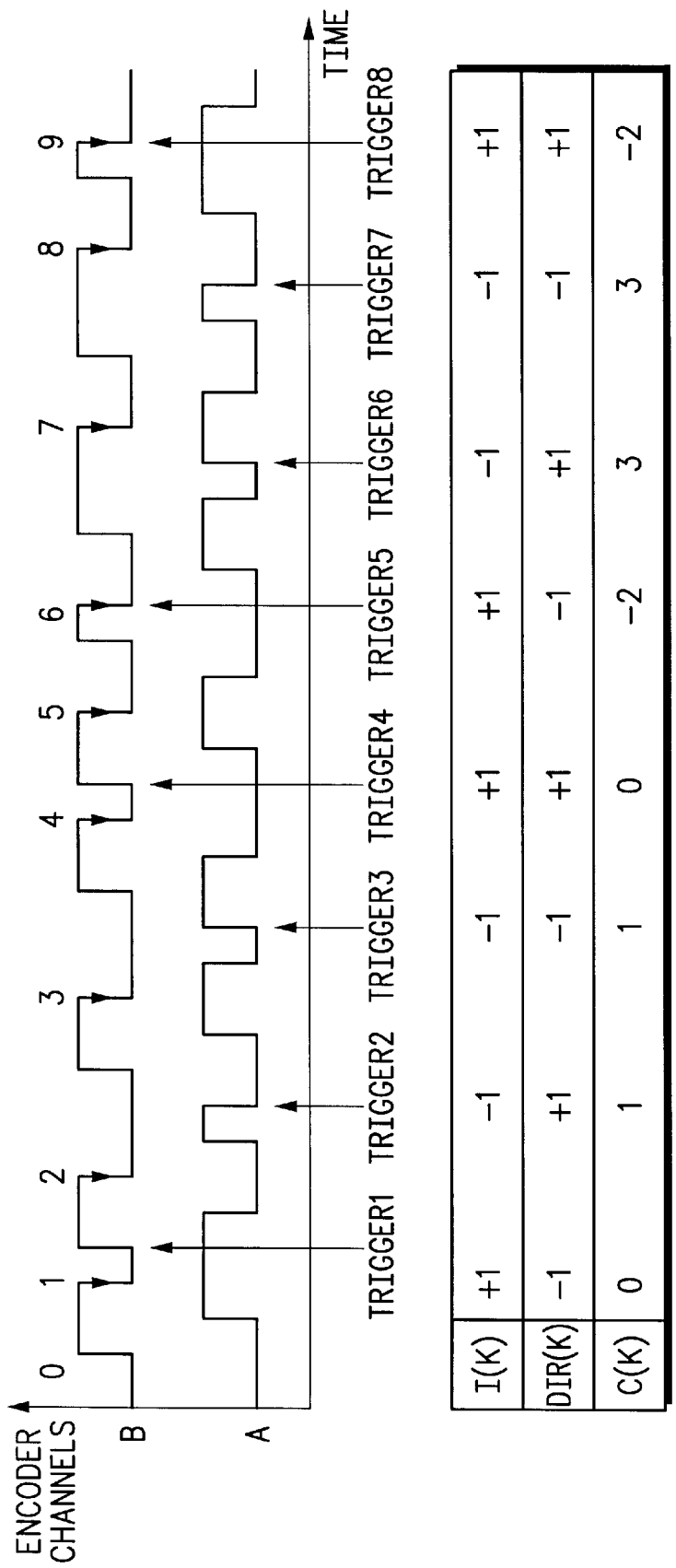
FIGS. 4–5 illustrates in timing diagram form timing scenarios according to one embodiment of the present invention.

One scenario of direction tracking is illustrated in FIG. 4, where encoder channels A and B are identified on the vertical axis of the timing diagram and time on the horizontal axis. The encoder signals each generate interrupts on each edge. In one embodiment, Timer A 10 and Timer B 12 are implemented with input capture timers, programmed for input capture on both rising and falling edges. Direction change trigger events are identified by the vertical arrows and are labeled TRIGGER1 through TRIGGER8. The table below the timing diagram tracks the values of i(k), dir(k) and c(k) at each trigger event. Note that no direction change triggers occur at the rest of the edge-triggered interrupts generated by Channels A and B. In the embodiment illustrated in FIG. 4, the falling edges of the encoder signal Channel B indicate when the PAC 18 is incremented. However, alternate embodiments may use the rising edges of Channel B, or either the rising or falling edges of Channel A to indicated when PAC 18 is incremented.

When software determines the encoder speed is below the threshold, sufficiently slow for a direction change to occur, edge-triggered interrupts are enabled to check for a direction change trigger event. There are Eight (8) possible encoder states to represent a direction change, as illustrated at each trigger indication (TRIGGER1 through TRIGGER8) of FIG. 4. For example, the first trigger, TRIGGER1, occurs when the series of encoder states is HH, LH, and HH (where the first H or L of each encoder state refers to a logical high level or a logical low level, respectively, of Channel B and the second H or L refers to a logical high level or a logical low level, respectively, of Channel A). This series of encoder states indicates that Channel B lagged Channel A (indicating a FORWARD direction), but at TRIGGER1, it is detected that Channel A now lags Channel B (indicating a BACKWARDS direction). Therefore, TRIGGER1 indicates that a change in direction has occurred.

At each encoder edge, the software checks the level of the opposing channel. In most cases, no trigger event has occurred (meaning no direction change is detected). However, if checking the level of the opposing channel reveals one of the 8 possible trigger scenarios illustrated in FIG. 4, then a trigger event has been detected. On detection of a trigger event, the direction tracking calculations provided above (in Equations 3–6) are performed. The values used in these calculations are listed in the table of FIG. 4, and are a function of the encoder state corresponding to the change in direction. The calculations are performed efficiently, requiring only adds and shifts, and requiring no multiplications or divisions. The shift operation is used for the multiplication of count(k) by 4 in the calculation of P(k).

For the example of FIG. 4, it is assumed that PAC 18 will increment on the falling edge of the Channel B waveform. For a uniform direction of motion, this event occurs every Four (4) quadrature counts. In the calculation of P(k), a numbering convention is established for the encoder states, beginning with 0 for the state immediately following the PAC increment, and counting FORWARD up to state 3. Using this encoder state numbering convention, a correction term c(k) is derived, which is added to 4*count(k) (where count(k) refers to the PAC 18 reading) to calculate P(k) (as shown in Equation 4). In most cases, c(k) is simply the state number. However, this simplistic approach fails if the direction change trigger event also corresponds to the increment of PAC 18, which is the case for the fifth and eighth triggers in FIG. 4 (TRIGGER5 and TRIGGER8). In both these cases, P(k) corresponds to state 2, which implies that two encoder state counts have occurred since the last increment of PAC 18 (when counting from zero). However, by the time the calculation is performed, PAC 18 has been incremented again, suggesting that four additional encoder counts have occurred. For these two cases, the 4 pseudo counts must be subtracted from the state number (2), resulting in a c(k) value of −2.

After P(k) has been calculated (using Equation 4) and used to determine a position delta (Equation 5), a new relative encoder position corresponding to P(k) must be recorded so that future encoder readings can be referenced with respect to it. That is, the old relative position $P_0$ has to be updated (Equation 6) with a new relative position based on P(k) to be used for future encoder readings. However, the encoder state number corresponding to the new relative position to be used for future readings is determined by counting BACKWARDS from the next anticipated PAC increment, assuming the encoder continues in the same direction. In this embodiment, the encoder state number determined by counting BACKWARDS from the next PAC increment differs by +/−1 count from the encoder state number used in Equation 4 to derive c(k) and calculate P(k), which is determined by counting FORWARD from the previous PAC increment. This +/−1 count error is taken into account by the i(k) term, which is added to P(k) to yield a corrected new relative position ($P_O$) to be used in future calculations. Thus, the old relative position $P_O$ is updated to the new relative position, P(k), corrected by a count error, i(k). This value of $P_O$ is then recorded for future use.

As an example, consider the first trigger (TRIGGER1) in FIG. 4. In this case, the encoder state preceding the trigger event (referred to as the "trigger state") is the state immediately following the increment of PAC 18 to 1. Therefore, the trigger state number obtained by counting FORWARD from the previous PAC increment is zero, and c(k) has a value of zero for the position delta calculation. If no additional trigger events occur between this one and the next increment of PAC 18 (which is true in this example), there will be Two (2) states between this trigger state and the next zero state. Counting BACKWARDS from the next zero state (which occurs at the next increment of PAC 18) implies that the state preceding it is state 3, and the state before that is state 2. Therefore, looking backwards from the next anticipated PAC increment implies that the state number for the trigger state should be 1, not 0. Therefore, the state number previously used to derive c(k) and calculate the position delta, Δ(k), must be incremented by one to correct it for future use. This is accomplished by the i(k) values, which either increment or decrement the state number by 1. Therefore, in FIG. 4, the first value of i(k) is 1 since the state number for the trigger state needs to be incremented from 0 to 1.

Referring to Table 1, recall that the "b values" associated with the absolute position calculation are a function of the encoder state and direction. As it turns out, these values are also the state number in relation to the PAC 18 increments, assuming uniform direction, with state 0 corresponding to the state immediately following the increment.

Figure 5:
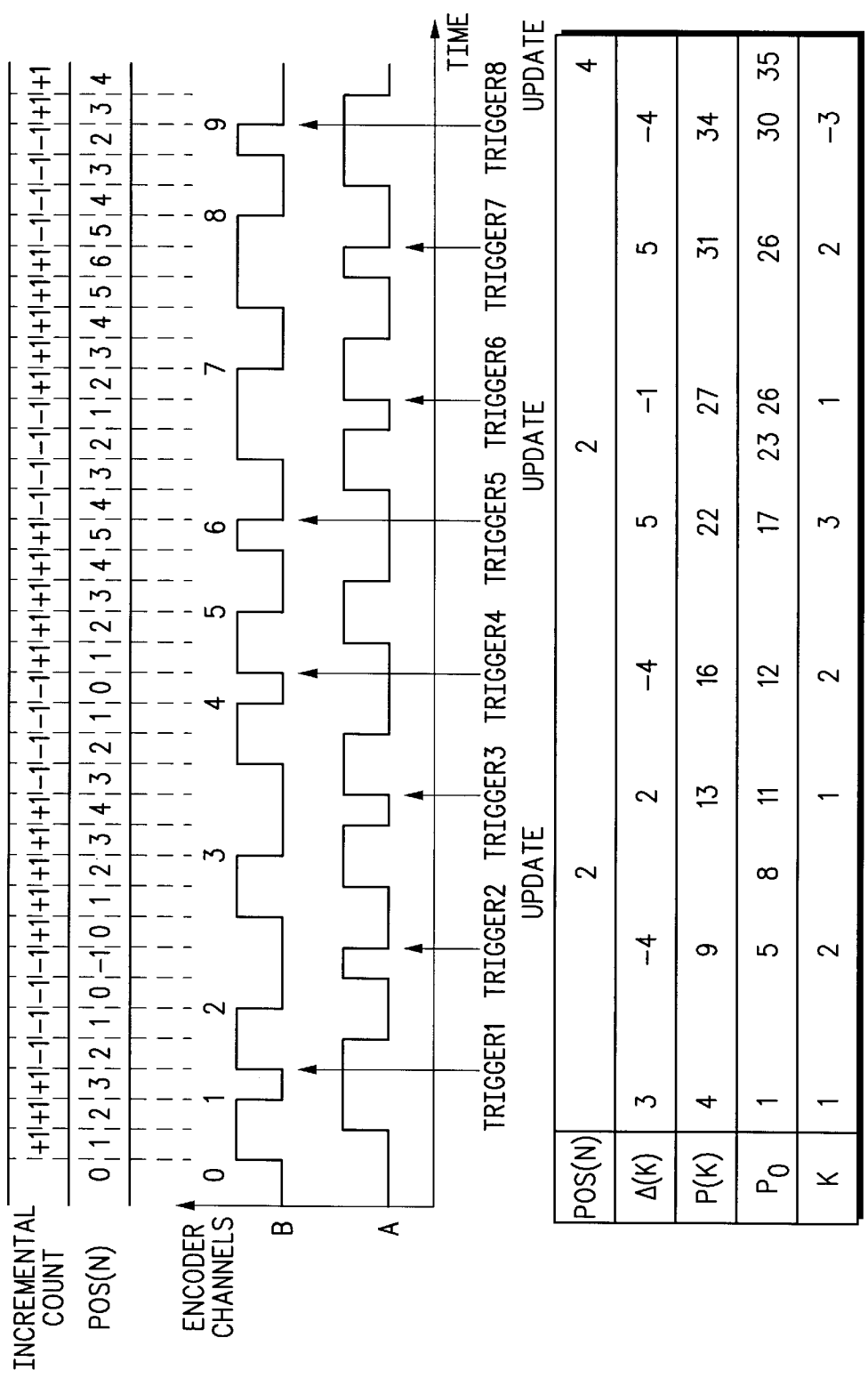

FIG. 5 illustrates an example of the calculations for absolute position tracking and direction tracking for the timing scenario of FIG. 4. The absolute position tracking is indicated as "UPDATE," and it is at these UPDATEs that POS(N) is calculated. Those calculations performed during direction tracking (Equations 3–6) are indicated corresponding to each trigger (TRIGGER1 to TRIGGER8) and the calculations associated with absolute position tracking (Equations 1–2) are indicated corresponding to each UPDATE.

The previous discussion of encoder states can assist in understanding the example of FIG. 5. At initialization, the encoder is at rest, so direction is undefined. It is arbitrarily assumed to be FORWARD. By inspection of the encoder waveforms (low and low), assuming FORWARD direction, the compensation factor (b) is determined to be 1. $P_O$ is initialized to this value, while POS(0) and the PAC counter are initialized to 0. Since the velocity is low, it is assumed that a direction change could occur. Therefore, encoder edge interrupts are enabled to inspect each encoder edge for a possible change of direction trigger.

Inspection of the first Three (3) encoder edges of Channels A and B confirms that the direction of motion is positive, or FORWARD, and no action is taken. Also, on the third encoder edge, the PAC value is incremented from 0 to 1. (As was discussed in reference to FIG. 4, the PAC increments on every falling edge of Channel B, according to this embodiment.) However, inspection of the fourth encoder edge reveals that a change in direction has occurred. Therefore, the change in direction counter k is incremented to 1 (see Equation 3). The value of c(k) is determined from FIG. 4 to be 0 for this trigger, and this value is added to four times the PAC count (which is 1), to obtain a value of 4 for P(k) (see Equation 4). The Δ(k) term is calculated by subtracting P(k) from $P_O$ (which is 1), and multiplying the result by the new direction (−1) to obtain a value of 3 (see Equation 5). $P_O$ is recalculated by adding I(k) for this particular trigger (which is +1) to P(k) (which is 4) to obtain a value of 5 (see Equation 6). $P_O$ is then stored for use with the next trigger calculation, or update calculation, whichever comes first.

Encoder motion continues in the reverse direction until the next direction change trigger event (TRIGGER2). By this time, the PAC has been incremented again to a value of 2. The trigger calculations repeat, starting with the change in direction counter k being incremented to 2. The value of c(k) is determined from FIG. 4 to be 1 for this trigger, and this value is added to four times the PAC count (which is 2) to obtain a value of 9 for P(k) (see Equation 4). The Δ(k) term is calculated by subtracting P(k) from $P_O$ (which is 5), and multiplying this by the new direction (+1) to obtain a value of −4 (see Equation 5). $P_O$ is recalculated by adding I(k) for this particular trigger (which is −1) to P(k) (which is 9) to obtain a value of 8 (see Equation 6). $P_O$ is then stored for use with the next trigger calculation, or update calculation, whichever comes first.

In this particular example, the next event is a scheduled UPDATE of the absolute position POS(n). (Note that these UPDATEs occur in response to a predetermined event, independent of the encoder channel edges. For example the UPDATES may occur in response to a periodic interrupt timer such as interrupt timer 16 of FIG. 1.) From Table 1, when both encoder signals are high and the direction is forward, b is found to be 3. $P_n$ is calculated by adding this value to 4 times the PAC reading (which is 2), for a result of 11 (see Equation 1). $P_O$ (which is 8) is subtracted from $P_O$, to yield a value of 3. Since the direction of rotation is FORWARD, we multiply this result by +1, which again yields a value of 3. This latest position delta must now be added with the two previous position deltas corresponding to k=1 and k=2. Thus, adding 3+3−4, yields a net position delta of +2. To obtain the new absolute position POS(1), this value is added to POS(0) (which was initialized to 0), yielding an absolute position of +2 (see Equation 2). As can be verified by inspection, this value exactly matches the position value in row 2 of FIG. 5, which was obtained by direct summation of the encoder incremental counts of row 1.

After performing the absolute position calculation, $P_O$ is set equal to $P_n$ (which is 11), and the change in direction counter k is reset to 0.

At high encoder speeds (at those speeds above a predetermined threshold), direction change tracking is effectively turned off and encoder edge-triggered interrupts are disabled. At these higher speeds, only the encoder independent interrupts need to be enabled. Therefore, the calculations provided above for absolute position tracking (e.g. Equation 2) do not impose an upper limit other than that limit imposed by the PAC 18 clock frequency requirements and counter size.

Embodiments of the present invention provide a method of tracking position independent of the encoder frequency. The position tracking calculations may occur periodically and may be in response to an occurrence of a predetermined event. The encoder pulses increment a counter to track the position. When the count indicates that a speed of the motor has fallen below a threshold, two edge-triggered interrupts are enabled to track the encoder transitions.

In one embodiment, the controller 32 is implemented using a microcontroller having at least two event driven timers for generating interrupts, at least one other timer for generating interrupts, and a pulse accumulator. Embodiments of the present invention are applicable to process controllers and other controllers, employing linear encoders, rotary encoders, or any encoders generating Two (2) signals with Four (4) edges. Embodiments of the present invention are particularly applicable where the resolution of monitor of the motor is critical, such as in medical applications where doses of medication are controlled by the position of the motor.

Embodiments of the present invention may be implemented using an algorithm including only shifts and additions, thus reducing the complexity of computations and increasing the speed of operation. A uni-directional pulse accumulator may be used to track position, as a count correction factor is used to adjust the count for discrepancies resulting from direction changes. The number of interrupts to the CPU 24 is greatly reduced, reducing the bandwidth impact.

In the foregoing specification, the invention has been described with reference to specific embodiments. However, one of ordinary skill in the art appreciates that various modifications and changes can be made without departing from the scope of the present invention as set forth in the claims below. For example, the terms FORWARD and BACKWARD (as well as positive and negative) are relative with respect to the actual motion of the shaft. That is, those of ordinary skill in the art can design a system using a different naming convention. Also, PAC 18 (or any counter that may be used) may be set to increment on either the rising or falling edges of either Channel A or Channel B. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for decoding a first channel and a second channel wherein each of the first and second channels is output by a quadrature encoder, comprising:
    calculating a position associated with the first and second channels in response to an encoder independent interrupt;
    comparing a speed associated with the first and second channels to a predetermined threshold; and
    enabling edge-triggered interrupts corresponding to the first and second channels if the speed is below the predetermined threshold.

2. The method of claim 1, further comprising:
    determining whether a direction change occurred in response to an edge-triggered interrupt; and
    if the direction change occurred, calculating a change in position and updating a direction corresponding to the first and second channels.

3. The method of claim 2, wherein calculating the position associated with the first and second channels uses the change in position.

4. The method of claim 2, wherein determining whether the direction change occurred comprises determining a state corresponding to the first and second channels.

5. The method of claim 2, further comprising:
    if a plurality of direction changes occurred, calculating a change in position corresponding to each direction change and updating a direction corresponding to the first and second channels.

6. The method of claim 5, wherein calculating the position associated with the first and second channels uses the changes in position.

7. The method of claim 1, wherein the first channel is input to a uni-directional counter, wherein the uni-directional counter increments in response to one of a rising edge and a falling edge of the first channel.

8. The method of claim 7, wherein calculating the position associated with the first and second channels uses a value of the uni-directional counter.

9. The method of claim 7, wherein the uni-directional counter includes a pulse accumulator.

10. The method of claim 1, wherein the edge-triggered interrupts are triggered by the rising and falling edges of the first and second channels.

11. The method of claim 1, wherein the first channel and second channels are quadrature waveforms.

12. The method of claim 1, wherein the encoder independent interrupt is generated by a periodic interrupt timer.

13. The method of claim 12, wherein the periodic interrupt timer is programmed with a predetermined sample rate.

14. The method of claim 1, wherein calculating the position further comprises calculating the speed associated with the first and second channels.

15. A computer readable medium comprising a plurality of instructions for performing the method of claim 1.

16. A data processing system comprising the computer readable medium of claim 15.

17. A decoder for decoding a first channel and a second channel, wherein each of the first and second channels is output by a quadrature encoder, comprising:
    a control unit;
    an edge-triggered interrupt generator having a first input to receive the first channel and a second input to receive the second channel, and capable of being enabled to provide edge-triggered interrupts to the control unit;
    an encoder independent interrupt generator coupled to provide encoder independent interrupts to the control unit;
    a counter, coupled to the control unit, having an input to receive the first channel; and
    a memory unit coupled to the control unit, comprising:
        a first plurality of instructions for calculating a position associated with the first and second channels in response to an encoder independent interrupt, and
        a second plurality of instructions for enabling the edge-triggered interrupt generator if a speed associated with the first and second channels is below a predetermined threshold.

18. The decoder of claim 17, wherein the control unit has an output for providing the position associated with the first and second channels.

19. The decoder of claim 17, wherein the counter is a uni-directional counter.

20. The decoder of claim 19, wherein the uni-directional counter includes a pulse accumulator.

21. The decoder of claim 17, wherein the encoder independent interrupt generator includes a periodic interrupt timer.

22. The decoder of claim 17, wherein the edge-triggered interrupt generator comprises:

a first timer coupled to receive the first channel and having an output to provide an edge-triggered interrupt corresponding to an edge of the first channel; and a second timer coupled to receive the second channel and having an output to provide an edge-triggered interrupt corresponding to an edge of the second channel.

23. The decoder of claim 17, wherein the memory unit further comprises:

a third plurality of instructions for determining whether a direction change occurred in response to an edge-triggered interrupt; and a fourth plurality of instructions for calculating a change in position if the direction change occurred.

24. A data processing system comprising the decoder of claim 17.

25. A method for decoding a first channel having a series of edges and a second channel having a series of edges, wherein each of the first and second channels is output by a quadrature encoder, comprising:

updating a uni-directional counter in response to the series of edges of the first channel;

calculating a position associated with the first and second channels in response to an encoder independent interrupt;

selectively enabling encoder dependent interrupts; and adjusting a value corresponding to the uni-directional counter in response to the encoder dependent interrupts if the encoder dependent interrupts are enabled.

26. The method of claim 25, wherein selectively enabling encoder dependent interrupts is based upon a speed associated with the first and second channels.

27. The method of claim 26, wherein the encoder dependent interrupts are enabled when the speed is below a predetermined threshold.

28. The method of claim 26, wherein the encoder dependent interrupts are triggered by the edges of the first and second channels.

29. The method of claim 25, wherein adjusting the value corresponding to the uni-directional counter further comprises:

determining whether a direction change occurred; and if the direction change occurred, calculating a change in position and using the change in position to adjust the value corresponding to the uni-directional counter.

30. The method of claim 29, wherein if the direction change occurred, updating a direction corresponding to the first and second channels.

31. The method of claim 25, wherein the series of edges of the first channel includes rising and falling edges, and the uni-directional counter is updated in response to one of the rising and falling edges.

* * * * *